United States Patent [19]

Navarrete

[11] Patent Number: 4,559,294
[45] Date of Patent: Dec. 17, 1985

[54] MANUFACTURING OF RELIEF PRINTING PLATES MADE OF PHOTO-SENSITIVE POLYMERIC MATERIAL

[75] Inventor: Juan A. Navarrete, Alcoy, Spain
[73] Assignee: Indagraf S/A, Barcelona, Spain
[21] Appl. No.: 640,157
[22] Filed: Aug. 10, 1984

[30] Foreign Application Priority Data

Aug. 31, 1983 [ES] Spain .................................. 525778
Jun. 26, 1984 [ES] Spain .................................. 533703

[51] Int. Cl.⁴ .............................................. G03F 7/02
[52] U.S. Cl. .................................... 430/306; 430/300; 430/302; 430/271; 430/273
[58] Field of Search ............... 430/300, 302, 306, 271, 430/273

[56] References Cited

U.S. PATENT DOCUMENTS 3,660,088  5/1972  Lundsager ........................... 430/273
4,424,089  1/1984  Sullivan .............................. 430/270

Primary Examiner—Jack P. Brammer
Attorney, Agent, or Firm—Michael J. Striker

[57] ABSTRACT

A method for manufacturing relief printing plates made of a photo-sensitive polymeric material, including the steps of providing a photographic negative having opaque areas and transparent areas defining a desired printing relief pattern, applying a layer of viscous photo-sensitive resin on the photographic negative, providing a flexible support base having a roughened surface, and applying it onto the layer of viscous resin with the roughened surface contacting the layer of resin, projecting ultra-violet radiation on the negative for hardening any of the resin which is exposed to the ultra-violet radiation through the transparent areas of the negative thereby forming the printing relief and causing the resin to adhere to the roughened surface during the hardening thereof, and removing the negative and recovering any of the resin which was behind the opaque areas of the negative and was not hardened.

11 Claims, 11 Drawing Figures

MANUFACTURING OF RELIEF PRINTING PLATES MADE OF PHOTO-SENSITIVE POLYMERIC MATERIAL

BACKGROUND OF THE INVENTION

This invention relates to improvements in the manufacturing of relief printing plates made of photo-sensitive polymeric material, which offer several advantages over conventional systems, these advantages being mainly cost-related.

As it is well known, the procedure for manufacturing of this conventional type of printing plate is as follows: a suitable photopolymeric material, i.e. a photo-sensitive viscous resin, and a photographic negative which is placed in an insolating machine must be used. The resin is poured on the negative and the whole is covered with a transparent polyester sheet. Then, ultraviolet light which is projected from both sides penetrates through this base and through the negative transparent portions (which correspond to letters or designs for the printing plate), the resin that has received the radiations becomes hardened and follows the letter or design edges. This action causes the final base to be formed by the polyester sheet and a hardened resin layer, from which the reliefs determining the letters or designs protrude. Manufacturing ends by washing with water and a neutral detergent at 40° C. to remove the remaining viscous resin, and then a second exposure to ultraviolet radiation is performed to harden the letters or design side walls. Afterwards, the printing plate is dried, becoming ready for its use.

This usual procedure has the disadvantage that not all the viscous resin among the hardened portions is recovered, since some amount of such resin constitutes the hardened layer which, together with the polyester sheet, determines the base of the printing plate.

SUMMARY OF THE INVENTION

Thus, it is an object of this invention to save about 60% of the resin in respect to the conventional system; This is obtained by using, instead of the clear polyester sheet, an opaque and rough sheet, normally of canvas on rubber, on which the radiation treated resin portions harden, while the resin below the negative opaque areas remains fully viscous and can be recovered, since no layer of that resin is used to form the printing plate base. In this system only the resin corresponding to letters or designs, which protrude from the canvas or rough similar surface, becomes hardened.

In addition, a perfect adhesion between the plate profiles or printing bodies and their flexible base is obtained, which guarantees a high strength avoiding any possibility of loss during the use.

These improvements are obtained by using, as a support for the aforementioned printing reliefs, a fully opaque flexible sheet, provided with a rough surface which ensures the adhesion and fixation on it of the mentioned printing reliefs. This support is, preferably, of canvas on rubber, and in this case the hardening ultraviolet radiations are only projected on the side opposite to that formed by such support, i.e. the one that presents the photographic negative, which causes the resin contained between the not transparent areas, i.e. the rubber-canvas base and the letters or designs, to be protected from radiation action and thus remaining completely in a viscous condition which allows a full recovery for ulterior uses.

Final printing reliefs, which are normally obtained through the irradiated transparent free areas of the photographic negative, show in this case the definitive constitution of extensions directly adhered to the supporting rough surface, which is always of a nature different from that of the resin used, and from which the viscous leftover has been fully removed after the hardening of the radiation treated portions and before the washing, the ulterior complementary exposure to harden the side walls of the reliefs down to the canvas, and assembly drying.

According to an improved variant of the mentioned improvements, printing plates of composite or single types are prepared. Composite plates, when their printing profiles have enough section for a good individual adhesion to the common flexible support, are formed using for that support, as a minimum, two superimposed layers of a different material and constitution put together, and which can be opaque, translucent, or transparent, being an internal layer of a textile nature (porous layer) and an external layers of a compact nature such as rubber, plastic or similar material. The internal porous layer remains directly attached to the mentioned individual printing profiles once the photo-sensitive resin that constitutes them has been hardened under the ultraviolet radiations applied to the side occupied by the initial negative.

When the mentioned printing profiles are of a small section, their adhesion to the support textile layer is ensured by means of a thin photo-sensitive resin layer which is left at the bottom, between a profile and the next profile. This thin resin layer is hardened together with the profiles without noticeably increasing support thickness nor affecting its flexibility.

Single type printing plates are prepared by making up their flexible support with a single layer of compact or of porous material, opaque, translucent, or transparent, such as rubber, fabric, plastic or similar material. The mentioned printing reliefs being directly and individually hardened on the internal side of that layer.

When the printing profiles to be hardened on the flexible support sole layer are of a small cross-section, their adhesion is ensured by means of the aforementioned thin layer of photo-sensitive resin between a profile and the next one, which becomes consolidated with the profiles under the radiation effect.

If the printing profiles are of a small section and the layer or layers constituting the support are of such a nature that does not allow the addition of the hardened resin layer among the profiles, then a transparent material is used for that or those layers of the flexible support and an enlargement in the base of the profiles is formed which increases the adhesion between the profiles and that support, obtaining in this case the consolidation of all printing profiles through irradiation from both plate sides, whether the plate is composite or single.

For best understanding of this specification a page with drawings is attached on which, by way of example and with no limitative character, are schematically shown the primary phases affected by the aforementioned improvements, as well as the types of printing plates obtained through them.

FIGS. from 8 to 11 show the same printing plates as the above Figures but prepared to have printing bodies or reliefs of a small cross-section, i.e. fine relieves.

DETAILED DESCRIPTION OF THE PREFERRED EMBODIMENTS

Figure 1:
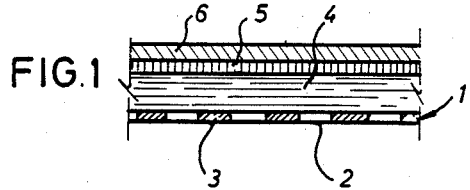
FIG. 1 shows the printing plate preparation phase, before the photo-sensitive resin hardening.

According to this invention the following procedure should be performed:

Prepare (FIG. 1) a chosen conventional photographic negative (1), which has respective transparent areas (2) and opaque areas (3), the former corresonding to letters, designs and similar which must appear on the finished printing plate.

Over this negative (1) a viscous resin (4) is poured or spread on and then an opaque sheet formed by a canvas piece (5) adhered to an external rubber layer (6) is applied on the resin.

Figure 2:
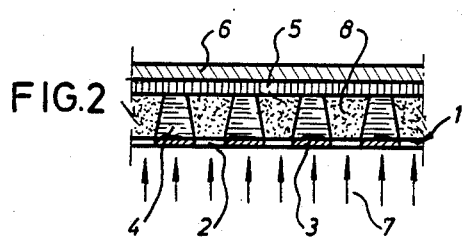
FIG. 2 corresponds to the phase of exposure to hardening radiations.
Figure 3:
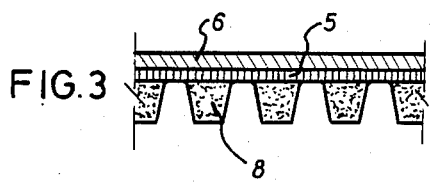
FIG. 3 shows the finished printing plate.

Afterwards (FIG. 2) the assembly is subjected to the unilateral action of ultraviolet radiations (7), which are only applied on the side where the photographic negative (1) is placed, and by reaching the resin (4) placed in front of the transparent areas (2) of the negative (1) causes its hardening and turns it into the relief bodies or profiles (8), which are strongly adhered to the canvas (5) and correspond exactly with letter or design outlines. The remaining viscous resin (4), (FIG. 3), i.e. the resin comprised among those reliefs (8), the opaque areas (3) of the negative (1), and the surface (5), which are not affected by the radiations because of the opaque areas (3), can be fully recovered, i.e. no layer of resin is formed on the canvas surface (5). The reliefs (8) are perfectly defined on their support or base (5-6).

From that phase in which, as above explained, resin has been recovered in a viscous condition, the printing plate passes through the normal phases or operations of washing (to eliminate the remnants of resin that may remain), second exposure with the same radiations (for hardening the reliefs' (6) side walls), and final drying of the whole with hot air. Since these phases are conventional, they have not been shown on the drawings.

Thickness of the canvas/rubber base (5-6) is very variable, according to the model of printing machine on which the plate must be used.

It is evident that the result obtained according to these explained improvements differs from the result obtained through the conventional procedure in the fact that the base, from which the printing reliefs or profiles (letters or designs) protrude, is now opaque (canvas and rubber) and there is no layer of photo-sensitive polymeric resin on it. This is opposite of what happens with the conventional support or base of polyester and the same resin. The amount of photo-sensitive resin now recovered is much greater than that obtained with the conventional system, since according to this invention resin protected from ultraviolet light in all sides is not hardened by the radiations.

It must be outlined that the canvas and rubber base could be replaced by any other opaque and flexible combination, provided that it had a rough surface to allow resin adhesion.

On the embodiments shown in FIGS. from 4 to 7 the developments hitherto explained have been further improved.

Figure 4:
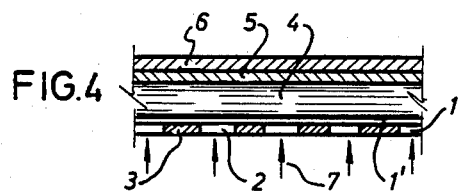
FIG. 4 is the schematic view of a composite type printing plate manufacturing phase.
Figure 5:
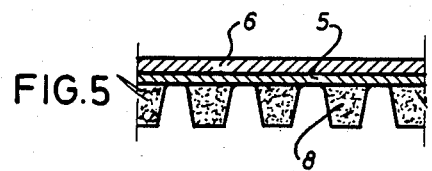
FIG. 5 illustrates a finished composite printing plate.

According to FIGS. 4 and 5, the printing plate is prepared starting from the usual photographic negative (1), provided with a protecting transparent film (1') and having the corresponding transparent (2) and opaque (3) areas. On this negative the photo-sensitive resin (4) is applied and then it is covered with a flexible base formed in this case, as a minimum, by two layers of a different nature: the internal layer (5) is textile (porous layer) and the external layer (6) is of a compact material such as rubber, plastic or similar material. These two layers (5) and (6) can be opaque, translucent, or transparent.

When the assembly is irradiated from the side where the negative (1) is placed, ultraviolet radiations (7) cause the already mentioned consolidation or hardening of the photo-sensitive resin (4) which is turned into printing bodies (8) (reliefs), in correspondence with the transparent areas (2) of the negative (1), while the remaining, not irradiated viscous resin is recovered for ulterior uses, as above indicated. These reliefs (8) remain strongly adhered on the textile layer (5), whatever the porosity or the compactness of the layer may be. As far as the mutual joint between the layers (5) and (6) is concerned, it is the same resin (4) that by solidifying ensures this joint by passing through the porous layer (5) and reaching the external, compact layer (6).

Figure 6:
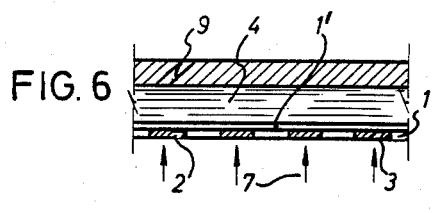
FIG. 6 shows a single type printing plate preparation phase.
Figure 7:
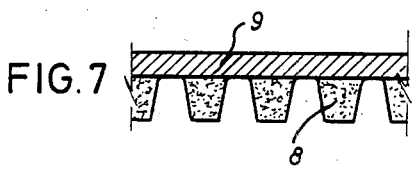
FIG. 7 shows a finished single type printing plate.

In the variant shown in FIGS. 6 and 7, the base of the printing plate is made up using only one flexible layer (9) of any compact or porous material such as rubber, fabric, plastics, or something else; opaque, translucent, or transparent, on the internal face of which are formed and fixed, through the action of radiations (7) on photosensitive resin (4) the aforementioned reliefs (8), the same was as in the prior example. As it can be seen, in this embodiment there is no porous intermediate layer (5) and the mentioned reliefs are directly applied on the single base (9).

It must be pointed out that in the case of FIGS. 4 and 5 the porous layer (5) is not limited to canvas fabric as it is in the main embodiment, it being possible to use a variety of fabrics. As far as the external layer (6) is concerned, several other materials can be used in addition to the original rubber.

In respect to the embodiment in FIGS. 6 and 7, the range of materials suitable to form the only layer (9) is very large, as above explained.

Figure 8:
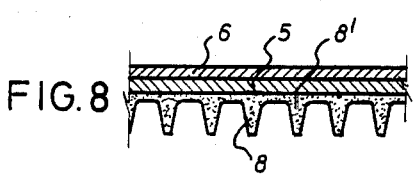
Figure 9:
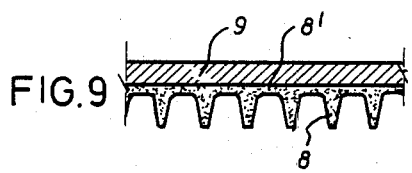

In both embodiments, the printing plate flexibiity is complete allowing it to be mounted on printing cylinders. In the printing plates of FIGS. 3, 5 and 7, the base of the normal printing bodies or reliefs (8) is large enough to have a good adhesion on the layer (5) or (9), but when these reliefs must be fine, i.e. of a small cross-section, then it is necessary to reinforce that adhesion having recourse to solutions in FIGS. from 8 to 11. If the thickness and flexibility of the printing plate support allow it, a thin layer of resin (8') is left between each relief (8) and the next one, which ensures the joining without noticeably increasing the thickness or reducing the flexibility of the printing plate. This auxiliary or bottom layer (8') can be applied in both the composite type printing plate (FIG. 8), i.e. the one formed by layers (5) and (6), and the single type (FIG. 9), determined by the single layer (9).

If the mentioned additional layer (8') had the effect of reducing the printing plate flexibility due to the nature of the layers (5) and (6), then it can be disregarded and, instead of it, an enlargement (8") of the base of the printing bodies or reliefs (8) can be used which increases the adhesion without affecting, however, the total thickness and with no reduction of flexibility.

These enlargements (8") can be performed in both the composite type printing plates (FIG. 10) determined by the layers (5) and (6), and the single type (FIG. 11) consisting of only one layer (9).

Figure 10:
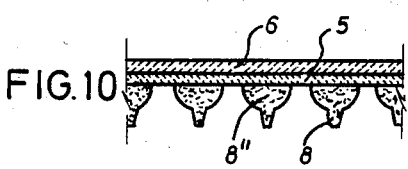
Figure 11:
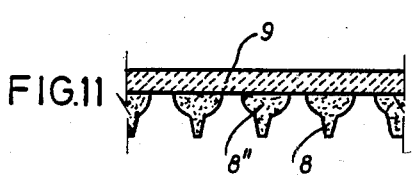

In the embodiments according to FIGS. 10 and 11, the hardening of the photo-sensitive resin must be performed on both, opposite support sides and in this case the support (layers (5) and (6) or layer (9)) must necessarily be of a transparent nature to allow the radiations passing through both the side corresponding to those enlargements (8") and the side of the printing profiles (8).

In the embodiments of FIGS. from 8 to 11 it must be understood that the photographic negative (1) and its protecting film (1') are used in the same way and function already explained.

As it can be seen, in every case the problem of the perfect adhesion between the photo-sensitive resin and the support is satisfactorily solved in both the normal, wide base printing relieves and the fine or having a small contact section ones, and in any case neither increasing the printing plate support total thickness nor affecting its required flexibility.

What we claim is:

1. A method for manufacturing relief printing plates made of a photo-sensitive polymeric material, comprising the steps of: providing a photographic negative having opaque areas and transparent areas defining a desired printing relief pattern; applying a layer of viscous photo-sensitive resin on said photographic negative; providing a flexible support base having a roughened surface and applying it on said layer of viscous resin with said roughened surface contacting said layer of resin; projecting ultraviolet radiation on only said negative for hardening any of said resin which is exposed to said ultraviolet radiation through said transparent areas of said negative, thereby forming the printing relief and causing said resin to adhere to said roughened surface during hardening; and removing said negative and recovering any of said resin from behind said opaque areas which was not hardened during said radiation projecting step.

2. A method as defined in claim 1, wherein said step of providing a flexible support base includes providing a flexible support base having at least two layers, one of said layers having said roughened surface.

3. A method as defined in claim 2, wherein said step of providing a support base having at least two layers includes providing a flexible support base having two superimposed layers of different material including an internal layer of a porous textile nature and an external layer of a compact nature.

4. A method as defined in claim 3, wherein said step of providing a flexible support base includes providing a flexible support base which is fully opaque.

5. A method as defined in claim 4, wherein said step of providing a flexible, fully opaque support base having at least two layers includes providing a flexible, fully opaque support base wherein said external layer is made of rubber and said internal layer is made of canvas, said canvas layer acting as said roughened surface for contacting said layer of resin.

6. A method as defined in claim 1, wherein said step of applying a viscous photo-sensitive resin includes providing a viscous photo-sensitive resin of a different material than said support base.

7. A method as defined in claim 6, wherein said radiation projecting step includes hardening of said resin to form a printing relief pattern having side walls; and further comprising the steps of projecting ultra-violet radiation on said side walls for hardening said side walls, and washing and drying the completed relief printing plates.

8. A method as defined in claim 3, wherein said step of providing a photographic negative includes providing a photographic negative having opaque areas and transparent areas which define a printing relief pattern made up of a plurality of printing reliefs which after said radiation projecting step form printing reliefs having a small cross-section; and further comprising the step of leaving a thin layer of said viscous resin on said support base between said reliefs for securing said reliefs to said roughened surface, said thin layer of resin not noticeably increasing the thickness of said support base nor affecting its flexibility.

9. A method as defined in claim 1, wherein said step of providing a flexible support base includes providing a flexible support base made of a single layer.

10. A method as defined in claim 9, wherein said negative providing step includes providing a photographic negative having opaque areas and transparent areas which define a printing relief pattern having a plurality of printing reliefs which after said radiation projecting step result in said printing reliefs having a small cross-section; and further comprising the steps of leaving a thin layer of said resin on said support base between said reliefs for securing said reliefs to said roughened surface.

11. A method as defined in claim 1, wherein said negative providing step includes providing a photographic negative having opaque areas and transparent areas defining a printing relief pattern having a plurality of printing profiles which after said radiation projecting step form profiles having a small cross-section, said support base providing step including providing a flexible transparent support base, and said radiation projecting step including projecting ultra-violet radiation on said negative and on said support base so as to form said printing profiles with an enlarged base portion thereby increasing adhesion between said profiles and said support base.

* * * * *